United States Patent
Chen et al.

(10) Patent No.: US 8,007,987 B2
(45) Date of Patent: Aug. 30, 2011

(54) MANUFACTURING METHODS OF ASYMMETRIC BUMPS AND PIXEL STRUCTURE

(75) Inventors: Te-Yu Chen, Kaohsiung (TW);
Chin-Lung Yeh, Taoyuan County (TW);
Yu-Fang Wang, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 469 days.

(21) Appl. No.: 12/339,076

(22) Filed: Dec. 19, 2008

(65) Prior Publication Data
US 2010/0104956 A1 Apr. 29, 2010

(30) Foreign Application Priority Data
Oct. 28, 2008 (TW) .............................. 97141477 A

(51) Int. Cl.
*G03F 7/20* (2006.01)
(52) U.S. Cl. ..................... 430/319; 430/321; 430/396
(58) Field of Classification Search ..................... None
See application file for complete search history.

(56) References Cited

U.S. PATENT DOCUMENTS

| 2002/0159010 A1 | 10/2002 | Maeda et al. | |
| 2003/0086035 A1* | 5/2003 | Chu et al. | 349/113 |
| 2003/0096198 A1* | 5/2003 | Wong et al. | 430/321 |
| 2003/0218698 A1* | 11/2003 | Otake et al. | 349/42 |
| 2004/0238969 A1* | 12/2004 | Chen | 257/786 |

FOREIGN PATENT DOCUMENTS
TW 200632452 9/2006
* cited by examiner

*Primary Examiner* — John A. McPherson
(74) *Attorney, Agent, or Firm* — Jianq Chyun IP Office

(57) ABSTRACT

A manufacturing method of asymmetric bumps is provided. First, a substrate is provided. A film layer is then formed on the substrate. Next, a complex photomask including at least one transparent region, a number of opaque regions, and a number of semi-transparent regions is provided. Each of the semi-transparent regions is disposed between two adjacent opaque regions, and at least one light-shielding pattern is randomly disposed in each of the semi-transparent regions. The film layer is then patterned with use of the complex photomask, and multiple asymmetric bumps are formed on the substrate. By using the complex photomask, manufacturing steps of the asymmetric bumps can be reduced. Besides, a manufacturing method of a pixel structure having the above-mentioned asymmetric bumps is also provided.

17 Claims, 16 Drawing Sheets

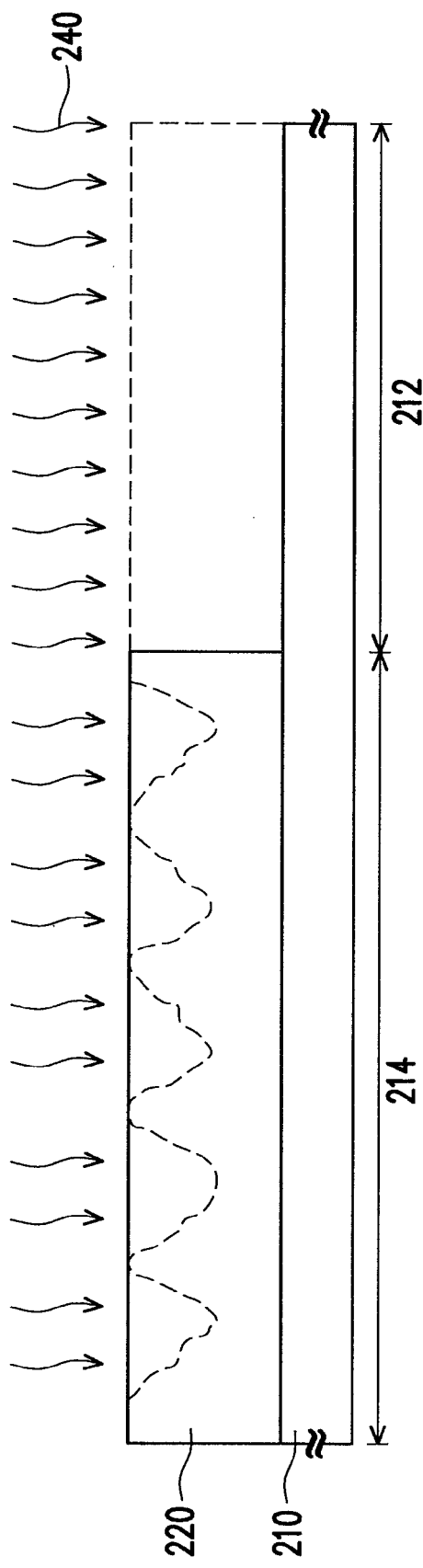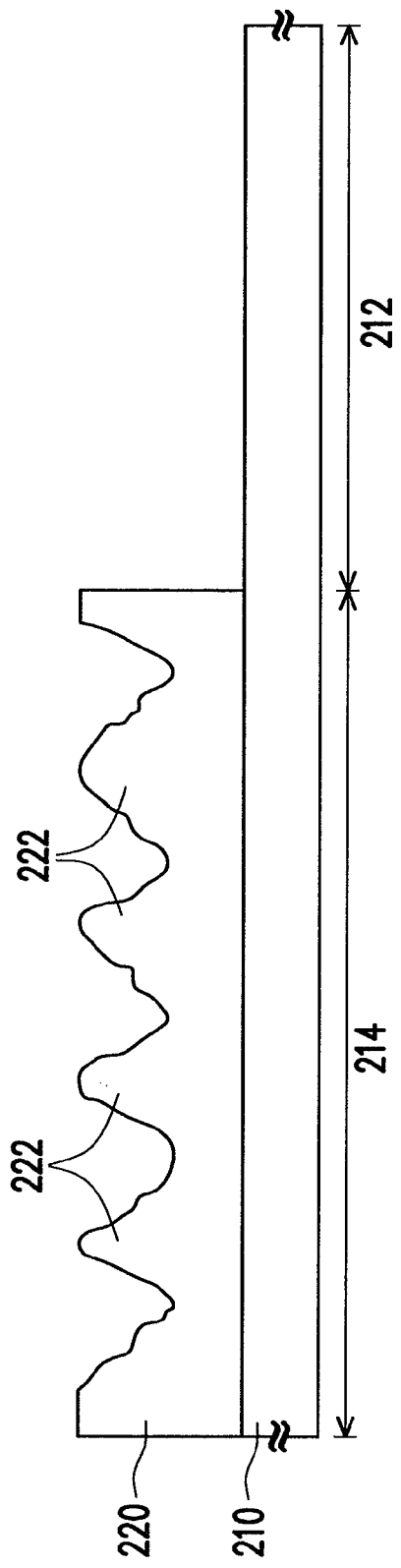
FIG. 6B
FIG. 6C

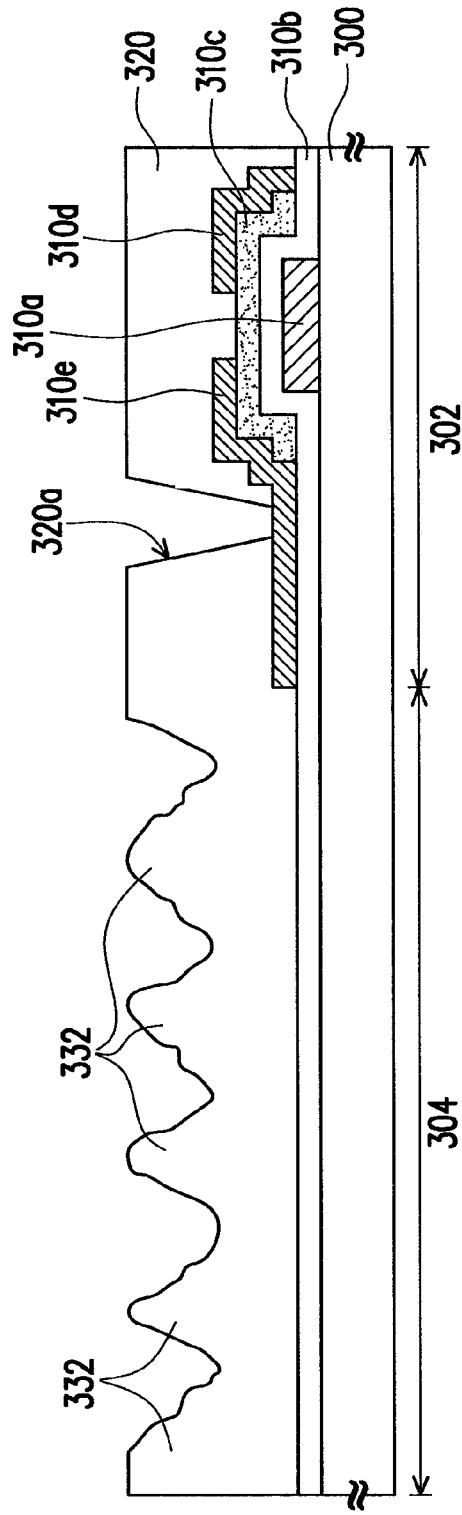
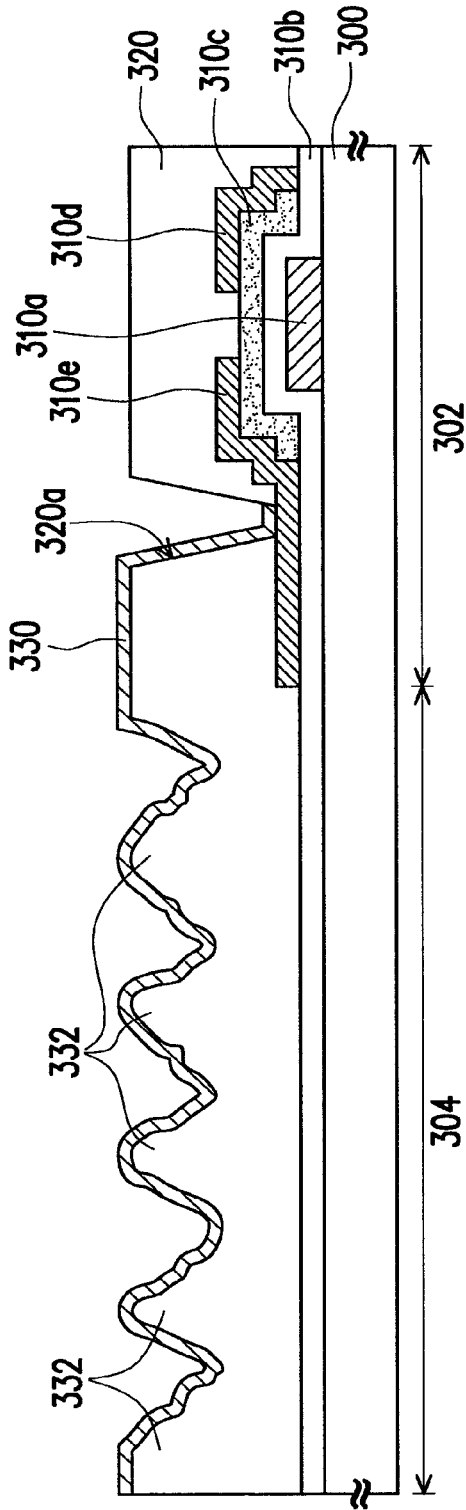
FIG. 7D
FIG. 7E

US 8,007,987 B2

MANUFACTURING METHODS OF ASYMMETRIC BUMPS AND PIXEL STRUCTURE

CROSS-REFERENCE TO RELATED APPLICATION

This application claims the priority benefit of Taiwan application serial no. 97141477, filed on Oct. 28, 2008. The entirety of the above-mentioned patent application is hereby incorporated by reference herein and made a part of specification.

BACKGROUND OF THE INVENTION

1. Field of the Invention

The present invention relates to a manufacturing method of bumps and a manufacturing method of a pixel structure having the bumps. More particularly, the present invention relates to a manufacturing method of asymmetric bumps capable of reducing the number of required photomasks and a manufacturing method of a pixel structure having the asymmetric bumps.

2. Description of Related Art

Thin film transistor liquid crystal displays (TFT-LCDs) can be categorized into transmissive TFT-LCDs, reflective TFT-LCDs, and transflective TFT-LCDs based on the way to utilize light sources. In a transmissive pixel structure, a transparent conductive material is used to form a transparent pixel electrode of the transmissive pixel structure, and required light is supplied by a backlight source. After passing through the transparent pixel electrode, the light can serve as a light source required by image display.

In a reflective pixel structure, a conductive material capable of reflecting light is frequently used to form a pixel electrode of the pixel structure. Thereby, an external light incident to the pixel electrode can be reflected for providing a light source required by image display. In a transflective pixel structure, each pixel electrode is formed by a reflective conductive thin film and a transparent conductive thin film, and the backlight source and an external light source are employed simultaneously. In said reflective pixel structure and said transflective pixel structure, a plurality of bumps is often formed for improving light reflectivity.

FIGS. 1A to 1B are schematic flowcharts illustrating partial fabrication of a conventional pixel structure having symmetric bumps. Referring to FIG. 1A, first, a film layer 120 is formed on a substrate 110 having a light transmitting region 112 and a light reflecting region 114. Next, a patterning process is performed on the film layer 120 with use of a photomask 100a. Here, the photomask 100a has an opaque region 102 and a transparent region 104. Specifically, the film layer 120 is irradiated by an exposure light beam L, and a development process is performed on the exposed film layer 120. After that, the film layer 120 in the light transmitting region 112 is removed. Referring to FIG. 1B, a gray-scale photomask 100b having a plurality of opaque regions 102 and a plurality of transparent regions 104 is provided. Another patterning process is performed on the film layer 120 in the light reflecting region 114 through the opaque regions 102 of the gray-scale photomask 100b, so as to form a plurality of symmetric bumps 126.

Based on the above, two photomasks are required for removing the film layer 120 in the light transmitting region 112 and forming the symmetric bumps 126 in the light reflecting region 114. As a result, the manufacturing process of the conventional pixel structure having the symmetric bumps 126 is rather complicated and time-consuming.

FIG. 2 is a schematic flowchart illustrating partial fabrication of another conventional pixel structure having symmetric bumps. Referring to FIG. 2, a half-tone photomask 100c, having a plurality of opaque regions 102, a transparent region 104 and a plurality of semi-transparent regions 106, is provided. A patterning process is performed on the film layer 120 with use of the half-tone photomask 100c. As such, only one photomask is required for fabricating the light transmitting region 112 and the symmetric bumps 126 in the light reflecting region 114 at the same time.

However, the manufacturing methods depicted in FIG. 1A, FIG. 1B and FIG. 2 are merely applicable to fabrication of the symmetric bumps 126 which are not capable of reflecting external light in an effective manner. To improve reflection of external light, a method of manufacturing a pixel structure having asymmetric bumps was proposed as indicated below.

FIGS. 3A to 3B are schematic flowcharts illustrating partial fabrication of a conventional pixel structure having asymmetric bumps. Referring to FIGS. 1A to 1B and FIGS. 3A to 3B, after the symmetric bumps 126 are formed by performing the steps shown in FIGS. 1A to 1B, another patterning process is performed on the symmetric bumps 126 (depicted in FIG. 1B) with use of another photomask 100d as shown in FIG. 3A. In the photomask 100d, the opaque regions 102 are randomly distributed. After the implementation of said patterning process, the symmetric bumps 126 become asymmetric bumps 128 as shown in FIG. 3B. Nonetheless, the method of manufacturing the asymmetric bumps 128 still requires at least two photomasks, which is rather uneconomical.

FIGS. 4A to 4B are schematic flowcharts illustrating partial fabrication of another conventional pixel structure having asymmetric bumps. Referring to FIG. 4A, a patterning process is performed on the film layer 120 with use of a gray-scale photomask 100e in which the opaque regions 102 are irregularly arranged. Thereby, light interference results in uneven exposure of the film layer 120.

As indicated in FIG. 4B, after a development process is performed on the exposed film layer 120, asymmetric bumps 128' with different heights are formed. Although only one gray-scale photomask 100e is required for manufacturing the asymmetric bumps 128', height difference of the asymmetric bumps 128' is quite significant, thus posing a negative impact on light reflectivity of the asymmetric bumps 128'.

As such, how to form uniform asymmetric bumps characterized by great light reflectivity with use of few photomasks has become an imperative research issue.

SUMMARY OF THE INVENTION

In view of the foregoing, the present invention is directed to a manufacturing method of asymmetric bumps with use of fewer photomasks, and the asymmetric bumps formed by applying said manufacturing method have uniform height.

The present invention is further directed to a manufacturing method of a pixel structure with use of fewer photomasks, and the pixel structure formed by applying said manufacturing method is equipped with asymmetric bumps having uniform height.

In the present invention, a manufacturing method of asymmetric bumps is provided. First, a substrate is provided. A film layer is then formed on the substrate. Next, a complex photomask, including at least one transparent region, a plurality of opaque regions and a plurality of semi-transparent regions, is provided. Each of the semi-transparent regions is disposed between two adjacent opaque regions, and at least one light-shielding pattern is randomly disposed in each of the semi-transparent regions. The film layer is then patterned with use of the complex photomask, and a plurality of asymmetric bumps is formed on the substrate.

In an embodiment of the present invention, the complex photomask is substantially formed by a half-tone photomask and a gray-scale photomask.

In an embodiment of the present invention, the number of the at least one light-shielding pattern in each of the semi-transparent regions is plural.

In an embodiment of the present invention, a method of forming the film layer on the substrate includes a spin coating method.

In an embodiment of the present invention, a material of the film layer includes an organic photosensitive material.

In an embodiment of the present invention, for example, the step of patterning the film layer with use of the complex photomask includes following steps. First, the film layer is irradiated by an exposure light beam with use of the complex photomask, wherein the at least one light-shielding pattern is randomly disposed in each of the semi-transparent regions and interferes with the exposure light beam to expose the film layer. Then, a development process is performed on the exposed film layer to form the asymmetric bumps.

In the present invention, a manufacturing method of a pixel structure is further provided. First, a substrate having an active device region and a pixel region is provided. Next, an active device is formed in the active device region of the substrate. A film layer is then formed on the substrate. Thereafter, a complex photomask including at least one transparent region, a plurality of opaque regions, and a plurality of semi-transparent regions is provided. Each of the semi-transparent regions is disposed between two adjacent opaque regions, and at least one light-shielding pattern is randomly disposed in each of the semi-transparent regions. After that, the film layer is patterned with use of the complex photomask, and a plurality of asymmetric bumps is formed in the pixel region of the substrate. A drain of the active device is also exposed during the patterning process. After that, a pixel electrode is then formed in the pixel region of the substrate. The pixel electrode is electrically connected to the drain and covers the asymmetric bumps.

In an embodiment of the present invention, the complex photomask is substantially formed by a half-tone photomask and a gray-scale photomask.

In an embodiment of the present invention, the number of the at least one light-shielding pattern in each of the semi-transparent regions is plural.

In an embodiment of the present invention, a method of forming the film layer on the substrate includes a spin coating method.

In an embodiment of the present invention, a material of the film layer includes an organic photosensitive material.

In an embodiment of the present invention, for example, the step of patterning the film layer with use of the complex photomask includes following steps. First, the film layer is irradiated by an exposure light beam with use of the complex photomask, wherein the at least one light-shielding pattern randomly disposed in each of the semi-transparent regions interferes with the exposure light beam to expose the film layer. Then, a development process is performed on the exposed film layer to form the asymmetric bumps.

In an embodiment of the present invention, a material of the pixel electrode includes metal.

In an embodiment of the present invention, the pixel region of the substrate includes a light reflecting region and an adjacent light transmitting region. Here, in the step of patterning the film layer with use of the complex photomask, the asymmetric bumps are formed in the light reflecting region, and the film layer in the light transmitting region is removed.

In an embodiment of the present invention, a material of the pixel electrode includes a transparent conductive material.

In an embodiment of the present invention, the transparent conductive material includes indium tin oxide (ITO) or indium zinc oxide (IZO).

In an embodiment of the present invention, the manufacturing method of the pixel structure further includes forming a reflective electrode on the pixel electrode covering the asymmetric bumps.

According to the present invention, the complex photomask is substantially constituted by the half-tone photomask and the gray-scale photomask. Hence, only one photomask is required for forming the asymmetric bumps with uniform height. As a result, the manufacturing method of the asymmetric bumps is conducive to reduction of manufacturing time and costs. The aforesaid manufacturing method of the asymmetric bumps is suitable for fabricating the asymmetric bumps used in a reflective pixel structure or a transflective pixel structure with reduced time and costs. Moreover, the asymmetric bumps formed thereby have uniform height, such that the reflective pixel structure or the transflective pixel structure can reflect light in a more efficient manner.

In order to make the aforementioned and other features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

FIGS. 6A to 6C are schematic flowcharts illustrating steps of patterning a film layer by using a complex photomask as a mask according to an embodiment of the present invention.

FIGS. 7A to 7E are schematic views illustrating a manufacturing process of a reflective pixel structure according to an embodiment of the present invention.

DESCRIPTION OF EMBODIMENTS

Manufacturing Method of Asymmetric Bumps

Figure 5A:
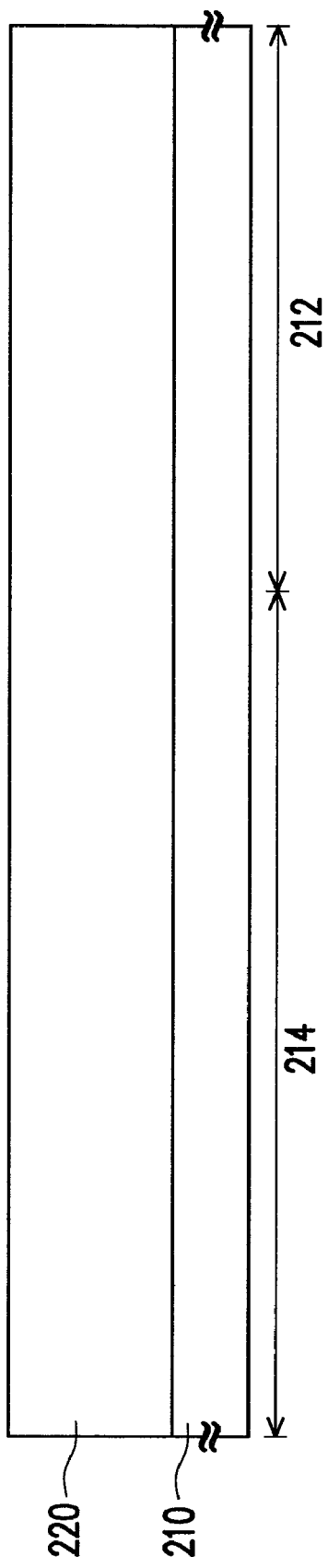
FIGS. 5A to 5B are schematic flowcharts illustrating a manufacturing method of asymmetric bumps according to an embodiment of the present invention.
Figure 5B:
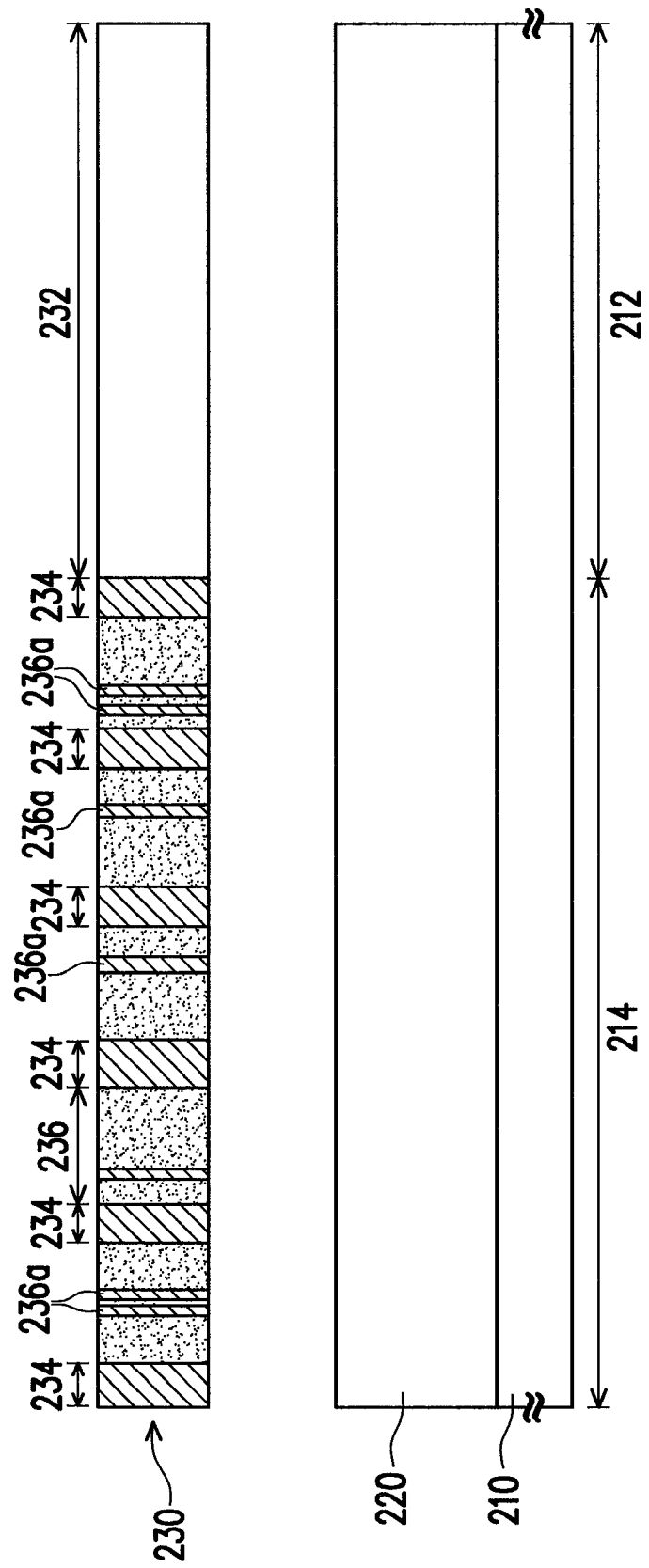

FIGS. 5A to 5B are schematic flowcharts illustrating a manufacturing method of asymmetric bumps according to an embodiment of the present invention. First, referring to FIG. 5A, a substrate 210 is provided. The substrate 210 can be a glass substrate, a quartz substrate, a plastic substrate, or any other appropriate substrate. Next, as shown in FIG. 5A, a film layer 220 is formed on the substrate 210. The film layer 220 is formed by, for example, applying a spin coating method, a printing method, a chemical vapor deposition (CVD) method, and so forth. In addition, the film layer 220 can be made of an organic photosensitive material, such as photoresist. The type of the photoresist should be in compliance with the photomask used herein. In the present embodiment, positive photoresist is taken for example, while the positive photoresist should not be construed as a limitation to the present invention.

Next, as indicated in FIG. 5B, a complex photomask 230 including at least one transparent region 232, a plurality of opaque regions 234, and a plurality of semi-transparent regions 236 is provided. Each of the semi-transparent regions 236 is disposed between two adjacent opaque regions 234, and at least one light-shielding pattern 236a is randomly disposed in each of the semi-transparent regions 236.

The film layer 220 is then patterned with use of the complex photomask 230 shown in FIG. 5B for forming a plurality of asymmetric bumps on the substrate 210. An embodiment elaborating steps of patterning the aforesaid film layer 220 is depicted in FIGS. 6A to 6C and is described hereinafter.

Figure 6A:
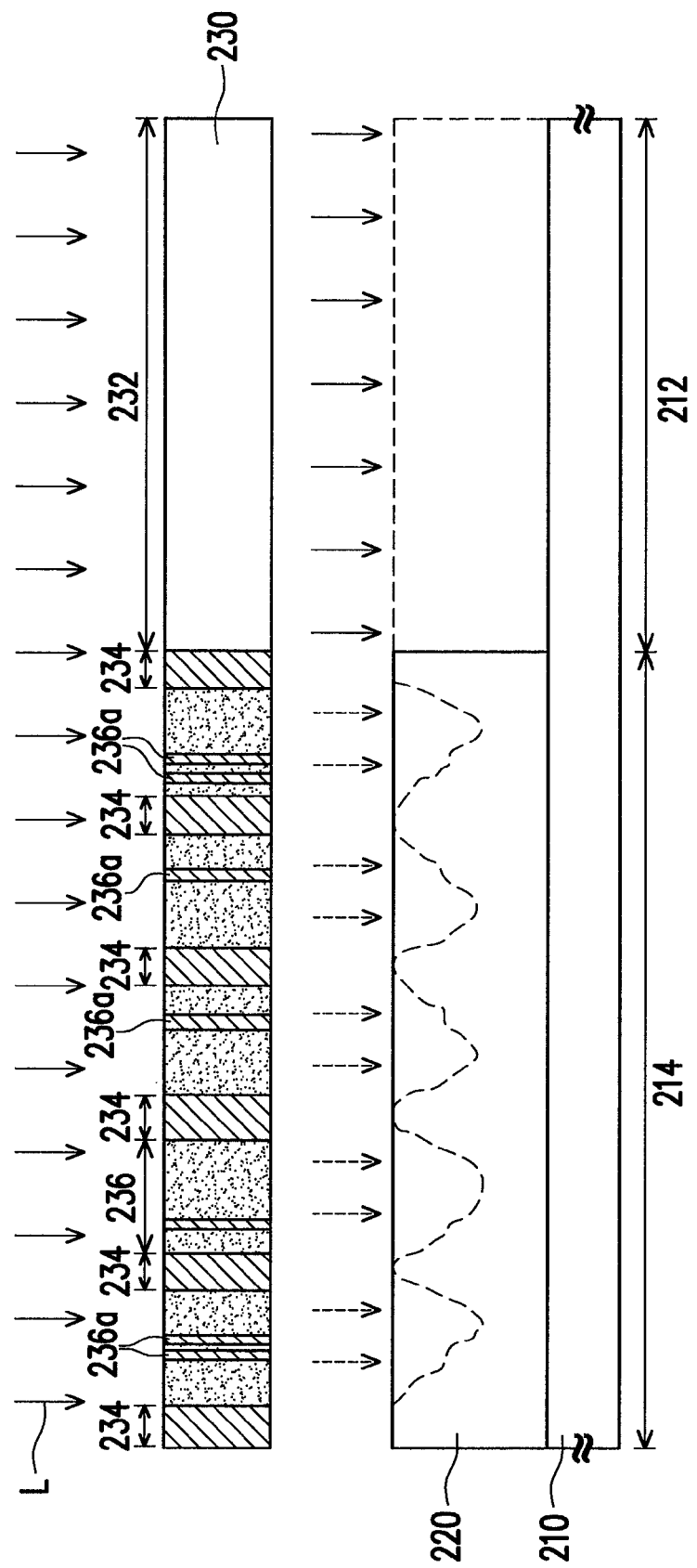

FIGS. 6A to 6C are schematic flowcharts illustrating steps of patterning a film layer by using a complex photomask as a mask according to an embodiment of the present invention. Referring to FIG. 6A, first, the film layer 220 is irradiated by an exposure light beam L with use of the complex photomask 230. Here, the at least one light-shielding pattern 236a randomly disposed in each of the semi-transparent regions 236 interferes with the exposure light beam L, so as to expose the film layer 220.

To be more specific, the film layer 220 disposed below the opaque regions 234 is not irradiated by the exposure light beam L and is thus not removed. As such, the film layer 220 that is not removed forms uniform peaks of asymmetric bumps 222 (as shown in FIG. 6C) in subsequent manufacturing processes. By contrast, the film layer 220 disposed below the transparent region 232 is irradiated by the exposure light beam L and is thus completely removed. Note that, the film layer 220 disposed below the semi-transparent regions 236 is somewhat exposed by the exposure light beam L and is partially removed. Therefore, the partially removed film layer 220 forms uniform valleys of the asymmetric bumps 222 in subsequent manufacturing processes. It should be mentioned that the at least one light-shielding pattern 236a randomly disposed in each of the semi-transparent regions 236 interferes with the exposure light beam L, such that the exposure light beam L unevenly irradiates the film layer 220. In other words, the film layer 220 disposed below each of the semi-transparent regions 236 is irradiated by the exposure light beam L to different degrees, so as to form the asymmetric bumps 222 (shown in FIG. 6C) in subsequent manufacturing processes.

Referring to FIGS. 6B and 6C, a development process 240 is then performed on the exposed film layer 220, so as to form the asymmetric bumps 222 indicated in FIG. 6C. The development process 240 can be implemented by using a developer to remove the partially exposed film layer 220 irradiated by the exposure light beam L. A frequently used wet development process includes, for example, a dipping process, a spin-spraying process, or a puddling process. Thereafter, the substrate 210 is flushed by pure water. After completion of the development process 240, the film layer 220 irradiated by the exposure light beam L is removed, and the asymmetric bumps 222 as shown in FIG. 6C are formed. The asymmetric bumps 222 have uniform height. Besides, each of the asymmetric bumps 222 has different profile and is able to reflect external light in an effective manner.

Referring to FIG. 5B again, the complex photomask 230 is substantially constituted by a half-tone photomask and a gray-scale photomask. Here, the half-tone photomask corresponds to the transparent region 232, the opaque regions 234, and the semi-transparent regions 236. By contrast, the gray-scale photomask corresponds to the at least one light-shielding pattern 236a in the complex photomask 230. That is to say, interference effects generated by the at least one light-shielding pattern 236a of the gray-scale photomask are expanded on the half-tone photomask. Hence, by randomly arranging the at least one light-shielding pattern 236a, the asymmetric bumps 222 in a light reflecting region 214 can be formed together with formation of a light transmitting region 212.

On the other hand, the number of the at least one light-shielding pattern 236a in each of the semi-transparent regions 236 can be plural, and thereby exposure performance of the exposure light beam L irradiating the film layer 220 can be adjusted for forming the asymmetric bumps 222 with even more satisfactory light reflectivity. FIG. 5B and FIG. 6A show one light-shielding pattern 236a or two light-shielding patterns 236a. However, the number of the at least one light-shielding pattern 236a is not limited in the present invention. Namely, the number of the at least one light-shielding pattern 236a can be increased or decreased based on actual demands. For instance, only one light-shielding pattern 236a is disposed in each of the semi-transparent regions 236. Alternatively, one or more light-shielding patterns 236a can be respectively disposed in the semi-transparent regions 236.

Figure 1A:
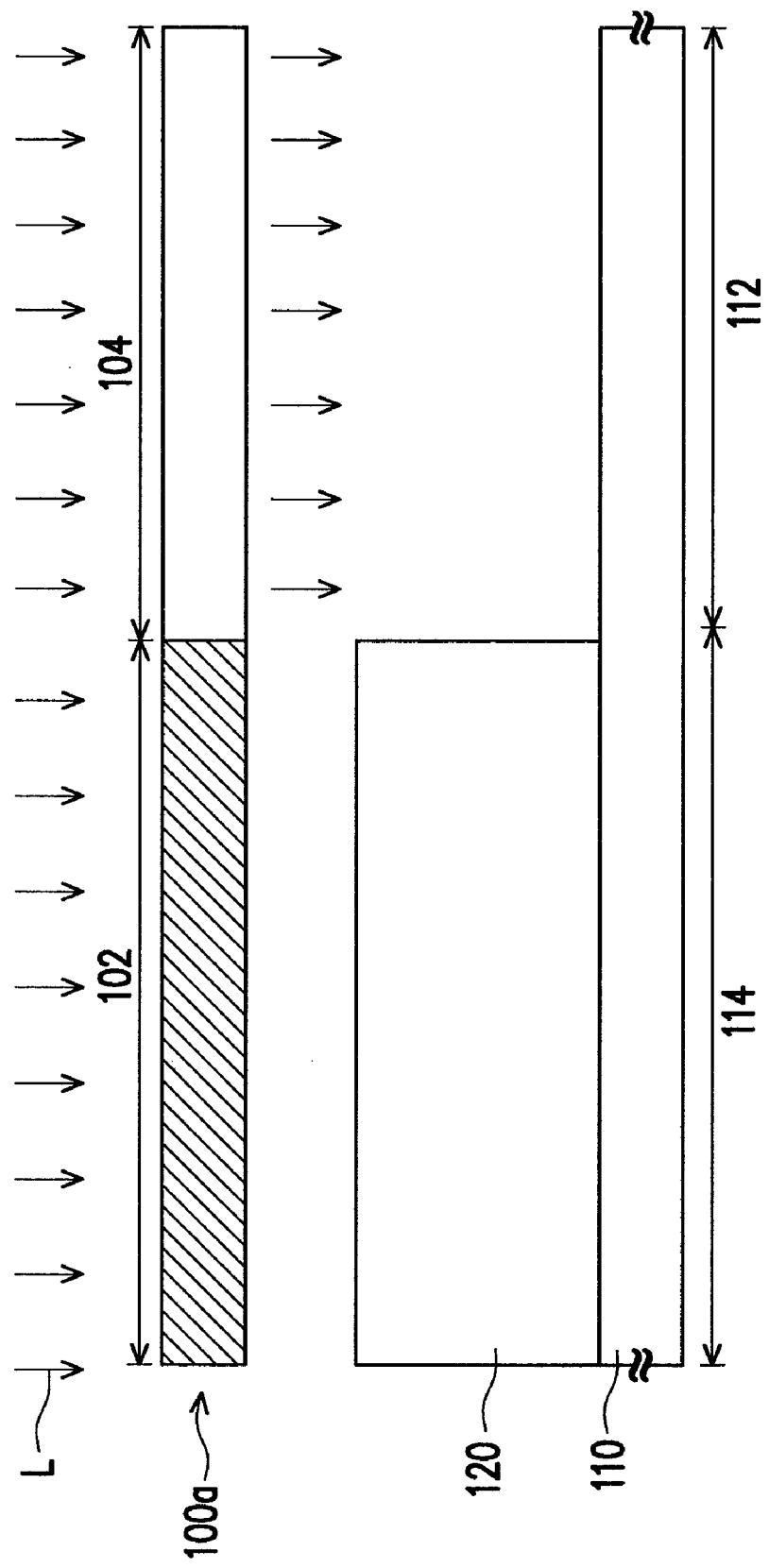
FIGS. 1A to 1B are schematic flowcharts illustrating partial fabrication of a conventional pixel structure having symmetric bumps.
Figure 1B:
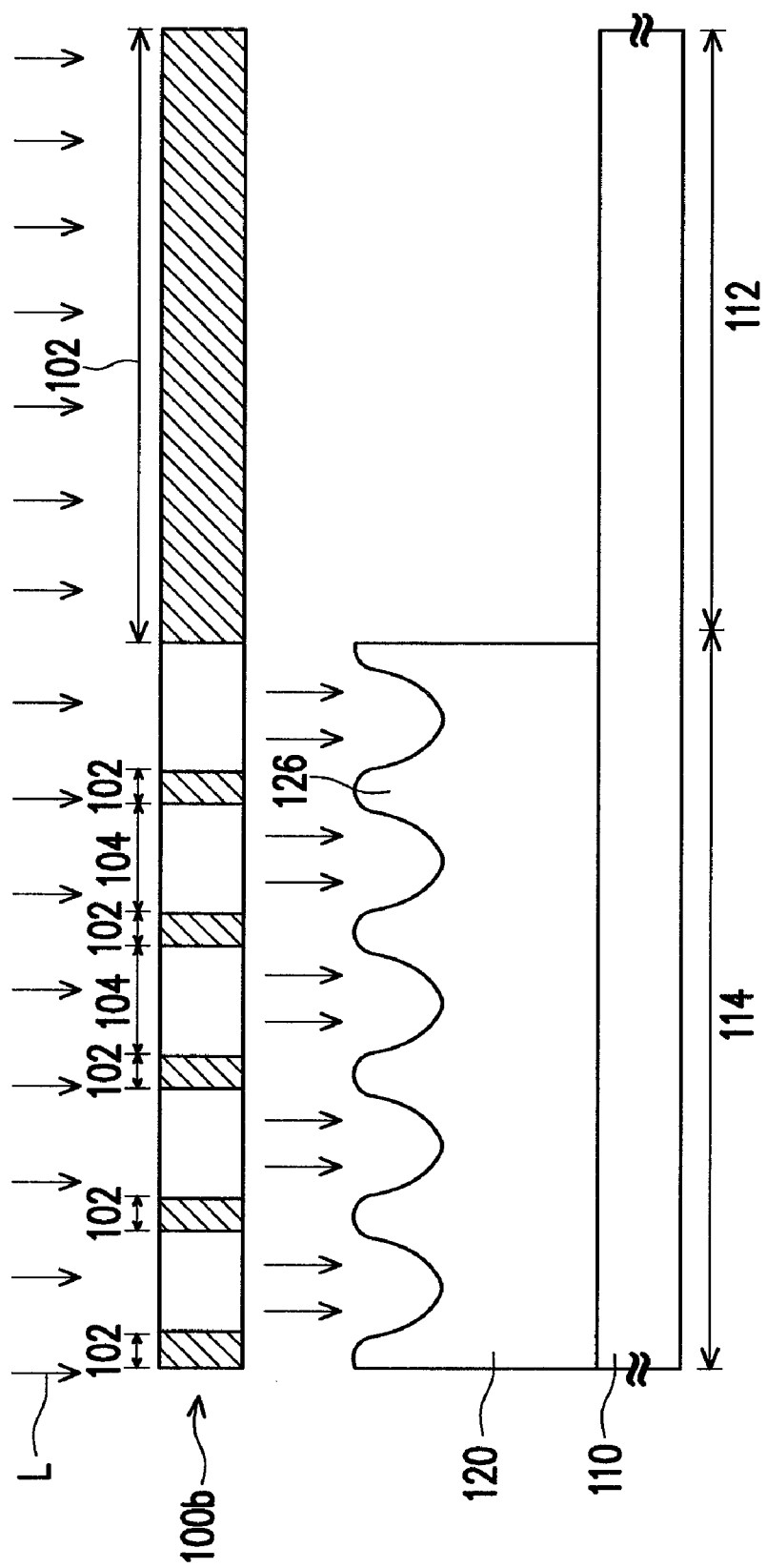
Figure 2:
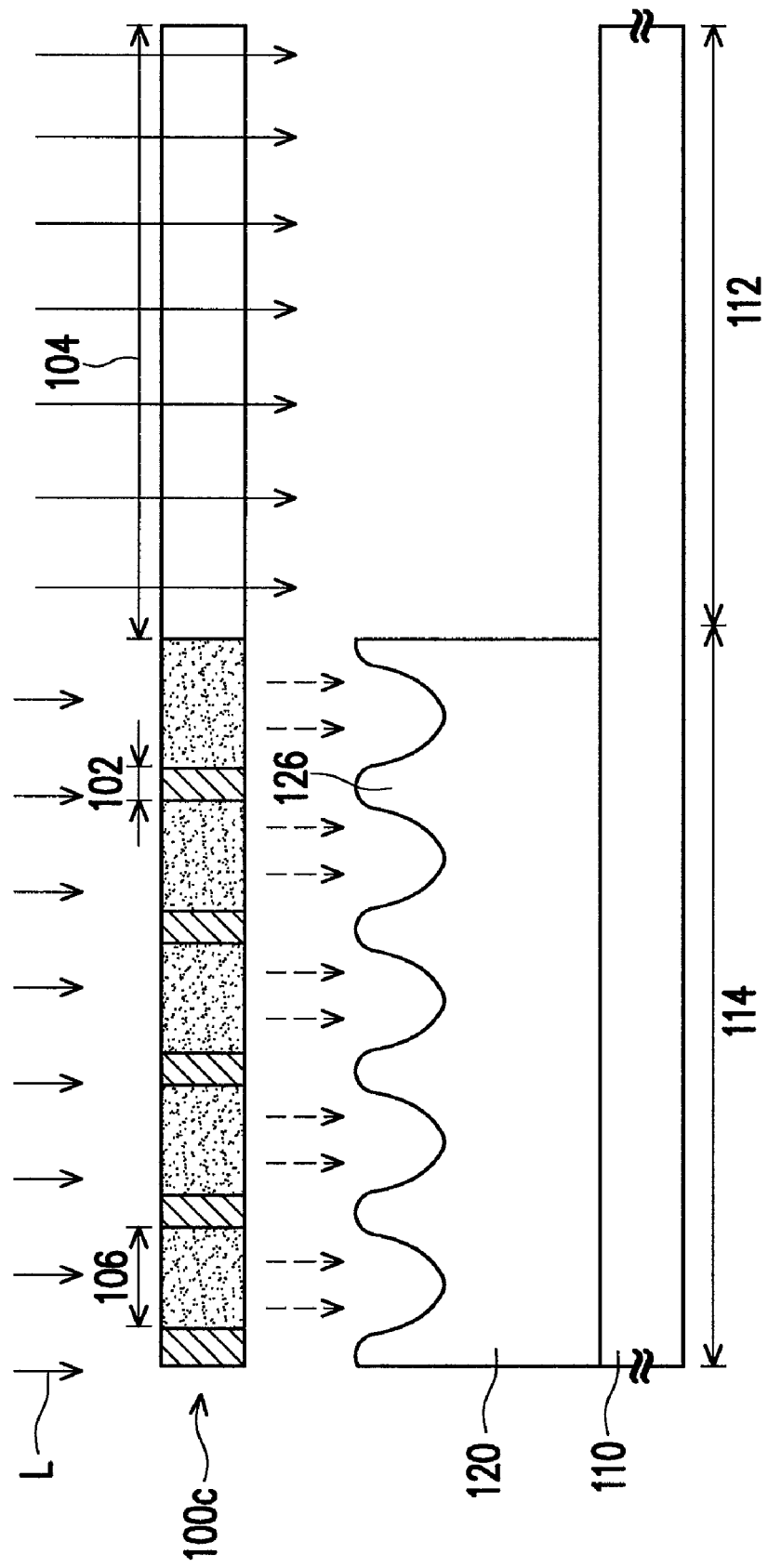
FIG. 2 is a schematic flowchart illustrating partial fabrication of another conventional pixel structure having symmetric bumps.
Figure 3A:
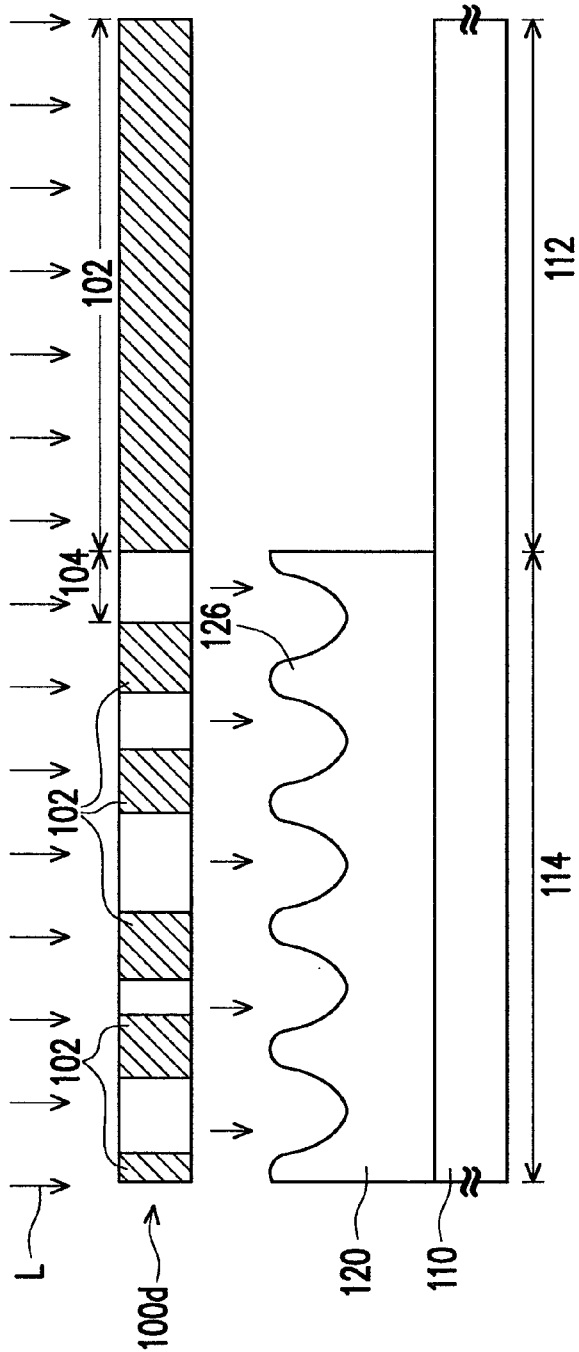
FIGS. 3A to 3B are schematic flowcharts illustrating partial fabrication of a conventional pixel structure having asymmetric bumps.
Figure 3B:
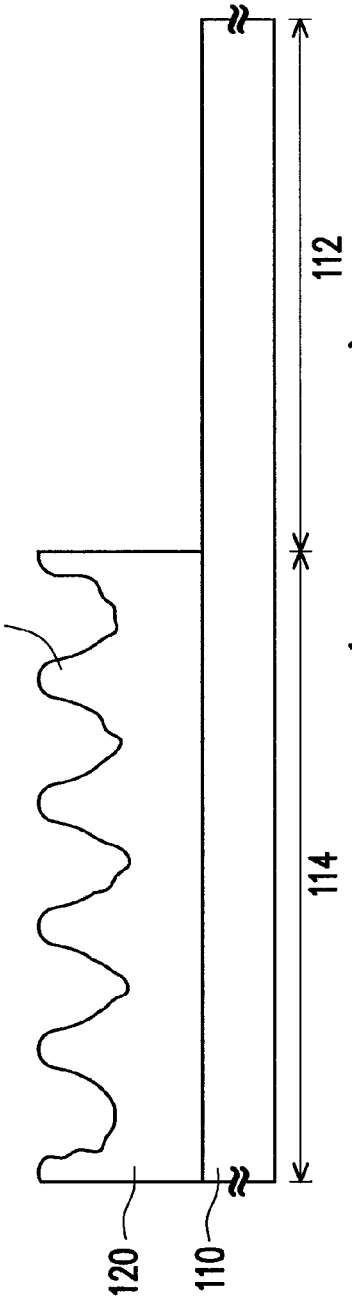
Figure 4A:
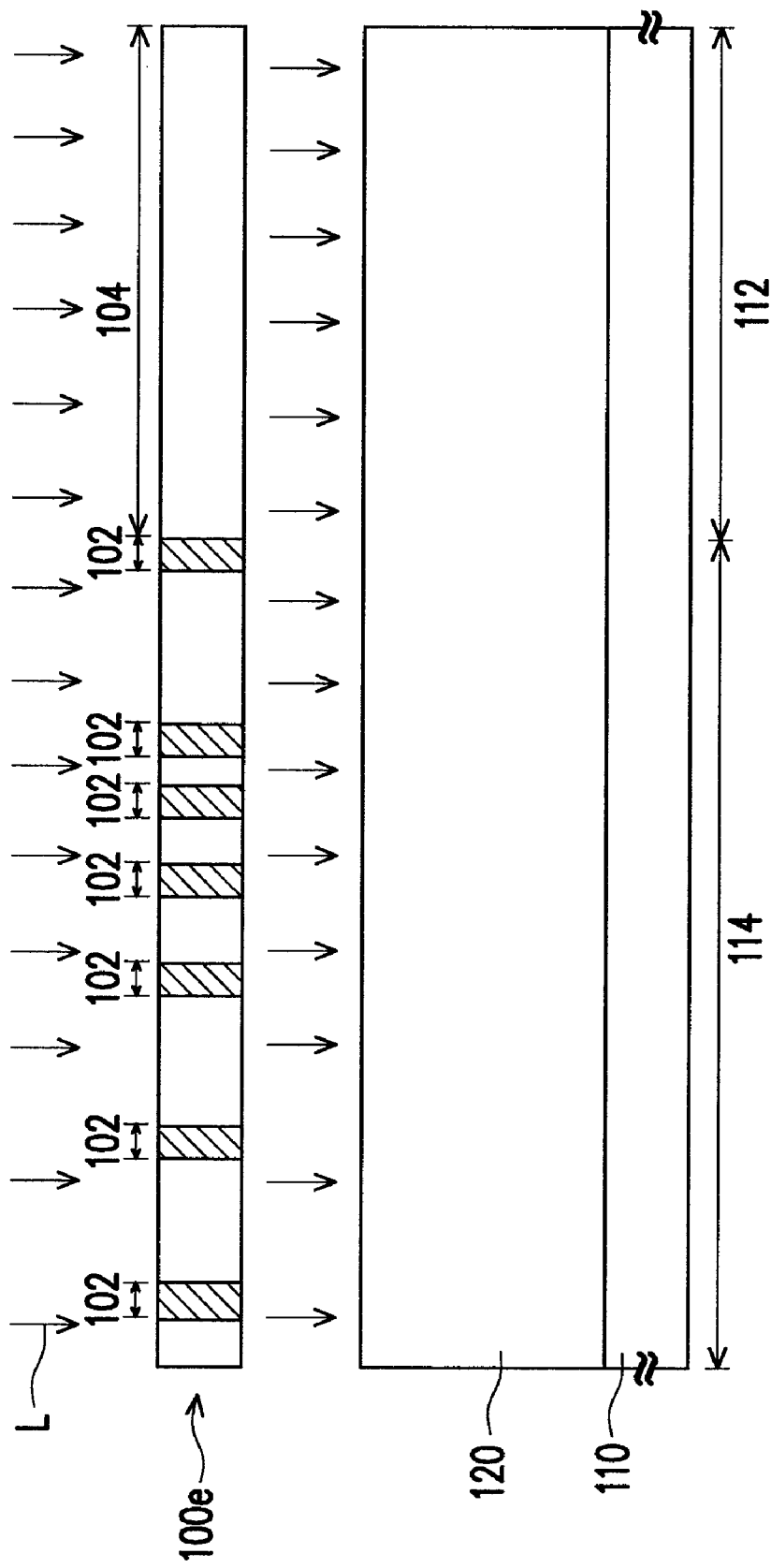
FIGS. 4A to 4B are schematic flowcharts illustrating partial fabrication of another conventional pixel structure having asymmetric bumps.
Figure 4B:
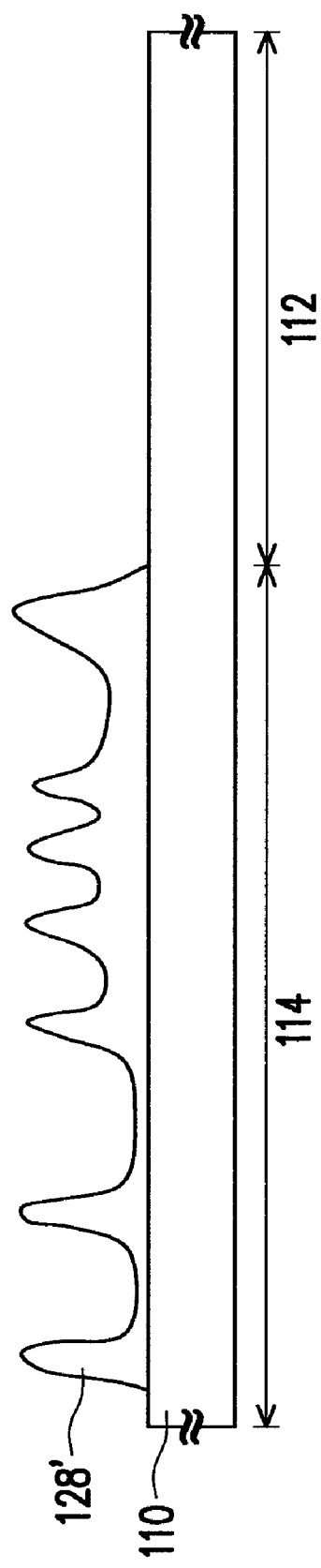

In light of the foregoing, only one complex photomask 230 is required for fabricating the asymmetric bumps 222, such that the film layer 220 disposed below the semi-transparent regions 236 is irradiated by the relatively weak exposure light beam L. Thereby, the valleys with the same depth are formed. Specifically, the at least one light-shielding pattern 236a on each of the semi-transparent regions 236 is randomly distributed, and therefore the at least one light-shielding pattern 236a interferes with the exposure light beam L. As a result, the peak of each of the asymmetric bumps 222 is partially removed, and the asymmetric bumps 222 with uniform height are formed. In comparison with the conventional asymmetric bumps 128' formed by using one gray-scale photomask as indicated in FIG. 4B, the asymmetric bumps 222 of the present embodiment have uniform height and can reflect light to a better extent.

In view of the above, by applying the manufacturing method of the asymmetric bumps 222 with use of only one photomask, the light transmitting region 212 can be formed, and a plurality of asymmetric bumps 222 with uniform height can also be formed in the light reflecting region 214. The manufacturing method of the asymmetric bumps 222 can be further applied to fabrication of a reflective pixel structure or a transflective pixel structure as indicated hereinafter.

Manufacturing Method of Pixel Structure

Figure 7A:
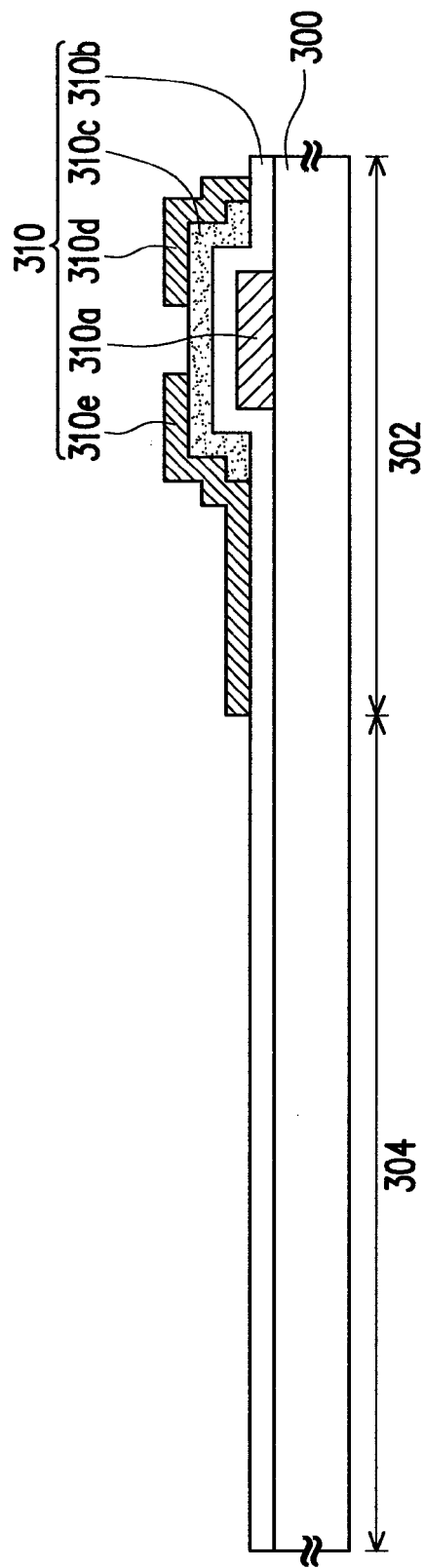

FIGS. 7A to 7E are schematic views illustrating a manufacturing process of a reflective pixel structure according to an embodiment of the present invention. Referring to FIG. 7A, a substrate 300 having an active device region 302 and a pixel region 304 is provided at first. The substrate 300 can be a glass substrate, a quartz substrate, a plastic substrate, or any other appropriate substrate.

Therefore, referring to FIG. 7A, an active device 310 is formed in the active device region 302 of the substrate 300. The active device 310 is, for example, a thin film transistor (TFT) or a switching element with three terminals. As indicated in FIG. 7A, the active device 310 includes a gate 310a, a gate insulating layer 310b, a semiconductor layer 310c, a source 310d, and a drain 310e. Here, the gate 310a is disposed on the substrate 300. The gate insulating layer 310b covers the gate 310a. The semiconductor layer 310c is located on the gate insulating layer 310b that is disposed above the gate 310a. The source 310d and the drain 310e contact the semiconductor layer 310c and are located at respective sides of the semiconductor layer 310c. The active device 310 can be formed with use of five photomask processes or four photomask processes.

Figure 7B:
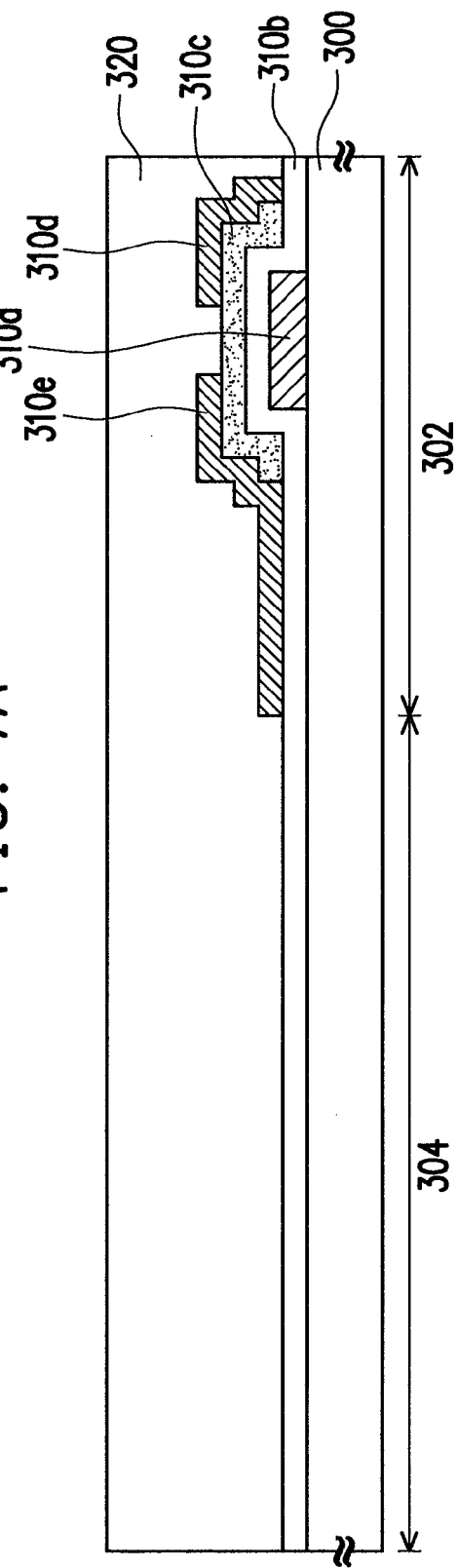

Referring to FIG. 7B, a film layer 320 is formed on the substrate 300. The film layer 320 covers the entire substrate 300 and the active device 310. Besides, the film layer 320 is formed on the substrate 300 by performing a spin coating process, a printing process, a chemical vapor deposition (CVD) process, and so on. In addition, the film layer 320 can be made of an organic photosensitive material, such as photoresist. In the present embodiment, the film layer 320 is made of positive photoresist, which should not be construed as a limitation to the present invention.

Figure 7C:
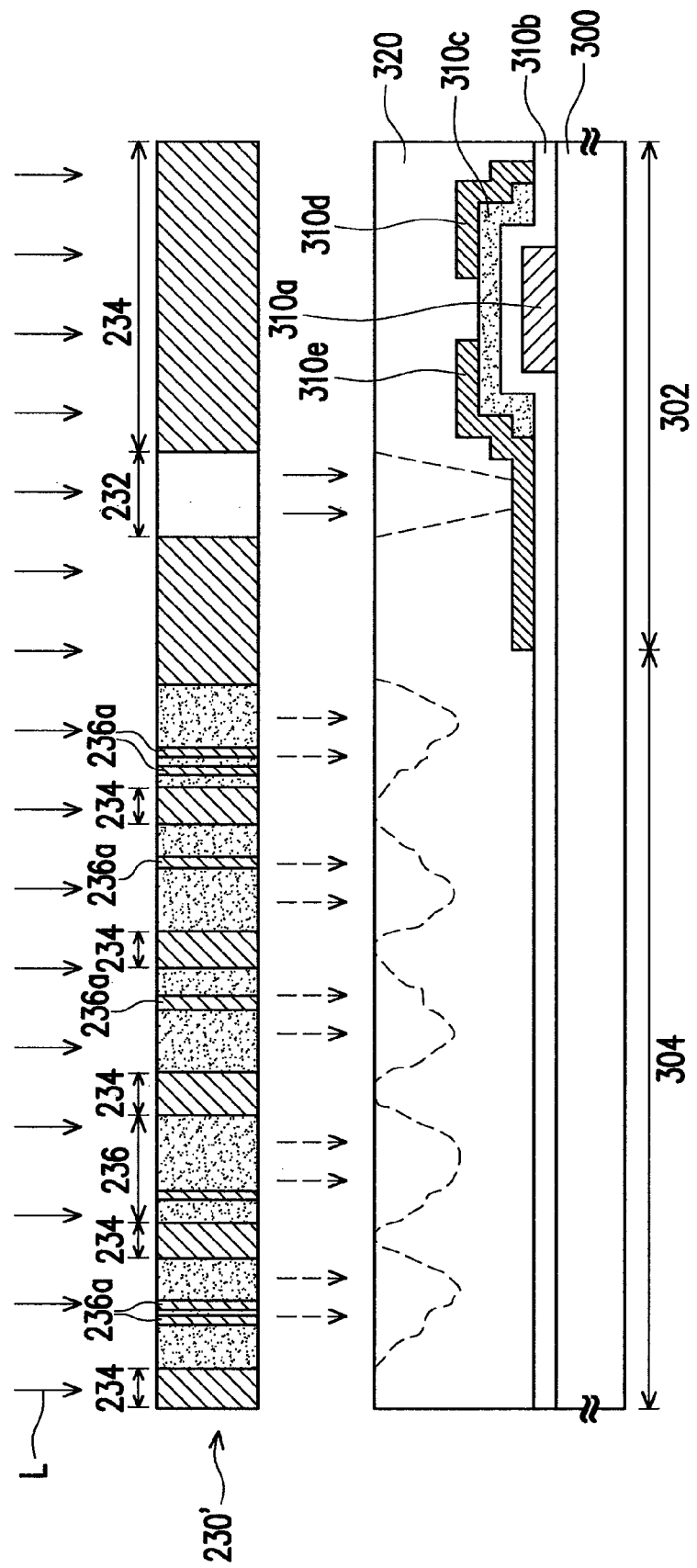

Referring to FIG. 7C, a complex photomask 230' is provided. The structure of the complex photomask 230' is similar to that of the complex photomask 230, and same reference numbers denote same elements in the complex photomask 230' and in the complex photomask 230. The difference between the complex photomasks 230' and 230 merely lies in that the transparent region 232 of the complex photomask 230 forms the light transmitting region 212 of FIG. 6C, while the transparent region 232 of the complex photomask 230' forms a contact opening 320a of FIG. 7D.

Thereafter, referring to FIGS. 7C and 7D, the film layer 320 is irradiated by an exposure light beam L with use of the complex photomask 230', and the film layer 320 is patterned. Thereby, a plurality of asymmetric bumps 332 can be formed in the pixel region 304 of the substrate 300, and a drain 310e of the active device 310 is exposed. An embodiment of patterning the film layer 320 for forming the asymmetric bumps 332 is similar to that depicted in FIGS. 6A to 6C, and therefore further descriptions are omitted herein. Note that the contact opening 320a is formed as shown in FIG. 7D, so as to expose the drain 310e.

Referring to FIG. 7E, a pixel electrode 330 is formed in the pixel region 304 of the substrate 300. The pixel electrode 330 is electrically connected to the drain 310e and covers the asymmetric bumps 332. A material of the pixel electrode 330 is, for example, metal or any other material characterized by high reflectivity. So far, the reflective pixel structure depicted in FIG. 7E is completely formed.

The asymmetric bumps 332 with uniform height in the reflective pixel structure are formed by using only one photomask. Hence, the fabrication of the reflective pixel structure can be further simplified, given that four photomask processes are used for forming the active device 310 of the reflective pixel structure.

Figure 8A:
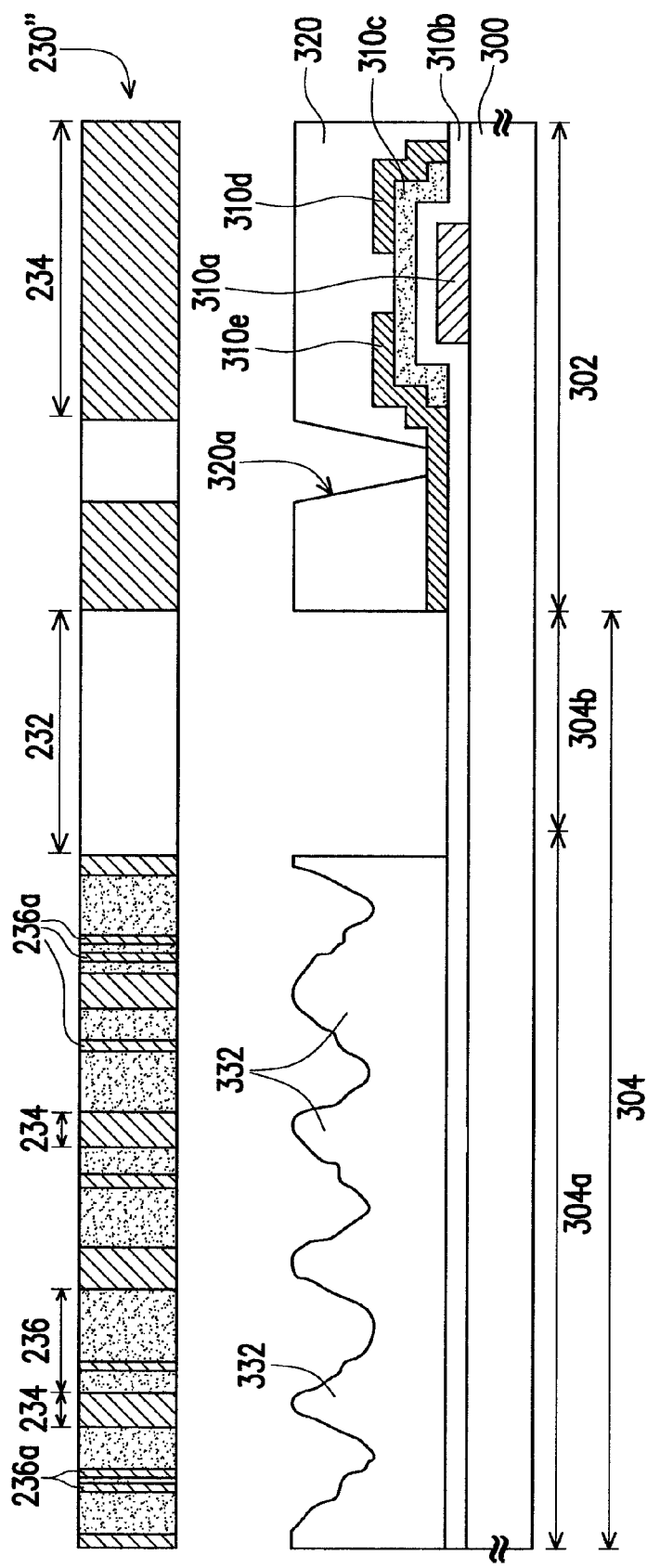
FIGS. 8A to 8C are schematic views illustrating some steps of manufacturing transflective pixel structure according to an embodiment of the present invention.
Figure 8B:
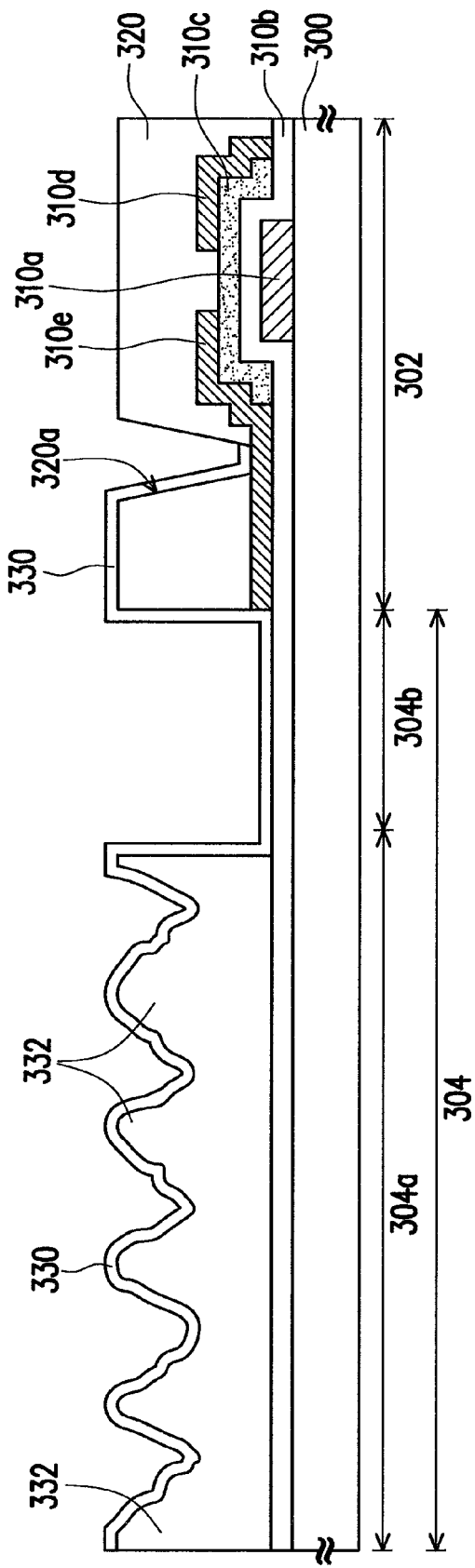
Figure 8C:
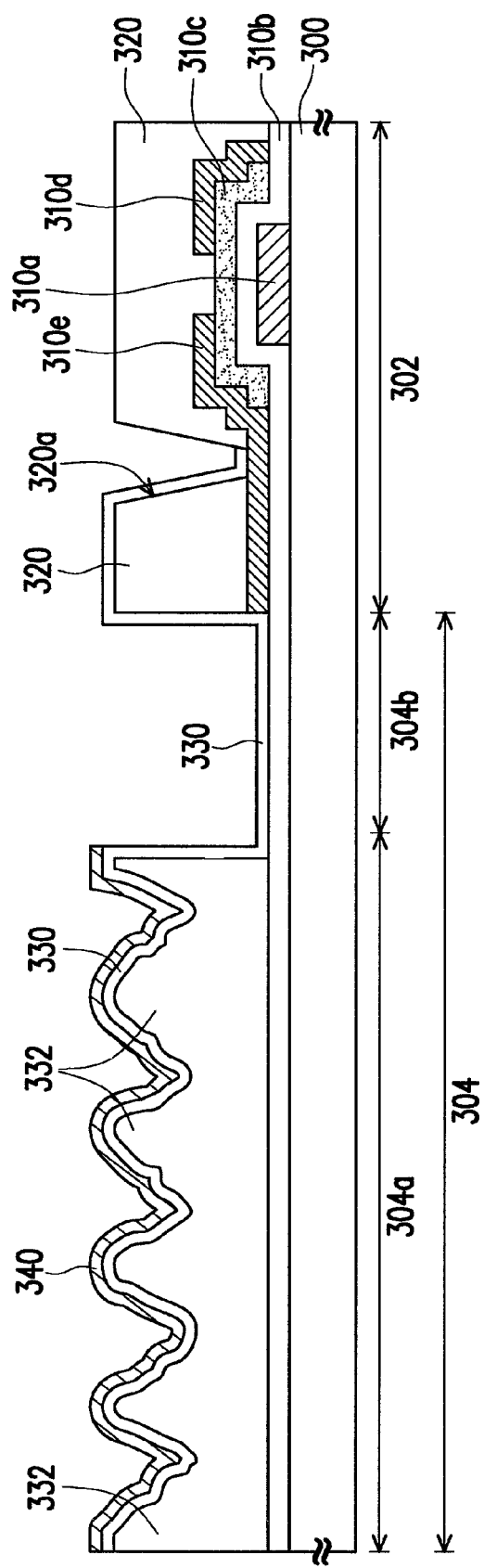

FIGS. 8A to 8C are schematic views illustrating some steps of manufacturing a transflective pixel structure according to an embodiment of the present invention. A manufacturing method of the transflective pixel structure as illustrated in FIGS. 8A to 8C are similar to that of the reflective pixel structure as indicated in FIGS. 7A to 7E, and same reference numbers refer to same elements. However, the main difference therebetween lies in that, the pixel region 304 of the substrate 300 in the present embodiment includes a light reflecting region 304a and a light transmitting region 304b. Here, in the step of patterning the film layer 320 with use of the complex photomask 230, a plurality of asymmetric bumps 332 is formed in the light reflecting region 304a, and the film layer 320 in the light transmitting region 304b is removed.

Referring to FIG. 8B, a pixel electrode 330 is then formed in the pixel region 304 and is electrically connected to the drain 310e. The pixel electrode 330 can be made of a transparent conductive material, such as ITO or IZO. A method of forming the pixel electrode 330 is, for example, a sputtering method. So far, the transflective pixel structure as indicated in FIG. 8B is completely formed.

Further, as indicated in FIG. 8C, a reflective electrode 340 can be further formed on the pixel electrode 330 which covers the asymmetric bumps 332. The reflective electrode 340 is, for example, made of metal or any other material characterized by high reflectivity. A method of forming the reflective electrode 340 includes, for example, performing a sputtering process with a shadow mask. Thereby, light reflectivity of the light reflecting region 304a can be further improved.

Based on the above, the asymmetric bumps 332 with uniform height in the transflective pixel structure are formed by using only one photomask. Hence, only five photomasks are required for fabricating the transflective pixel structure, given that four photomask processes are used for forming the active device 310 of the transflective pixel structure.

In view of the foregoing, the manufacturing method of the asymmetric bumps and the manufacturing method of the pixel structure in the present invention at least have following advantages:

The complex photomask combines characteristics of the half-tone photomask and the gray-scale photomask. Therefore, the asymmetric bumps with uniform height can be formed by using fewer photomasks. In addition, the transflective pixel structure or the reflective pixel structure can be formed by performing simplified manufacturing process, given that only four photomask processes are used for fabricating TFTs. Moreover, at least one light-shielding pattern is randomly arranged in the semi-transparent regions. As such, the asymmetric bumps with similar heights can be formed, such that great light reflectivity can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a plurality of asymmetric bumps, comprising:
   providing a substrate;
   forming a film layer on the substrate;
   providing a complex photomask, the complex photomask comprising at least one transparent region, a plurality of opaque regions and a plurality of semi-transparent regions, wherein each of the plurality of semi-transparent regions is disposed between two of the plurality of opaque regions adjacent to each other, and at least one light-shielding pattern is randomly disposed in each of the plurality of semi-transparent regions; and
   patterning the film layer with use of the complex photomask and forming the plurality of asymmetric bumps on the substrate.

2. The manufacturing method of the plurality of asymmetric bumps as claimed in claim 1, wherein the complex photomask is substantially formed by a half-tone photomask and a gray-scale photomask.

3. The manufacturing method of the plurality of asymmetric bumps as claimed in claim 1, wherein the number of the at least one light-shielding pattern in each of the plurality of semi-transparent regions is plural.

4. The manufacturing method of the plurality of asymmetric bumps as claimed in claim 1, wherein a method of forming the film layer on the substrate comprises a spin coating method.

5. The manufacturing method of the plurality of asymmetric bumps as claimed in claim 1, wherein a material of the film layer comprises an organic photosensitive material.

6. The manufacturing method of the plurality of asymmetric bumps as claimed in claim 1, the step of patterning the film layer with use of the complex photomask comprising:
    irradiating the film layer by an exposure light beam with use of the complex photomask, wherein the at least one light-shielding pattern randomly disposed in each of the plurality of semi-transparent regions interferes with the exposure light beam to expose the film layer; and
    performing a development process on the exposed film layer to form the plurality of asymmetric bumps.

7. A manufacturing method of a pixel structure, comprising:
    providing a substrate, the substrate having an active device region and a pixel region;
    forming an active device in the active device region of the substrate;
    forming a film layer on the substrate;
    providing a complex photomask, comprising at least one transparent region, a plurality of opaque regions and a plurality of semi-transparent regions, wherein each of the plurality of semi-transparent regions is disposed between two of the plurality of opaque regions adjacent to each other, and at least one light-shielding pattern is randomly disposed in each of the plurality of semi-transparent regions;
    patterning the film layer with use of the complex photomask, wherein a plurality of asymmetric bumps in the pixel region of the substrate is formed and a drain of the active device is exposed; and
    forming a pixel electrode in the pixel region of the substrate, the pixel electrode being electrically connected to the drain and covering the plurality of asymmetric bumps.

8. The manufacturing method of the pixel structure as claimed in claim 7, wherein the complex photomask is substantially formed by a half-tone photomask and a gray-scale photomask.

9. The manufacturing method of the pixel structure as claimed in claim 7, wherein the number of the at least one light-shielding pattern in each of the plurality of semi-transparent regions is plural.

10. The manufacturing method of the pixel structure as claimed in claim 7, wherein a method of forming the film layer on the substrate comprises a spin coating method.

11. The manufacturing method of the pixel structure as claimed in claim 7, wherein a material of the film layer comprises an organic photosensitive material.

12. The manufacturing method of the pixel structure as claimed in claim 7, the step of patterning the film layer with use of the complex photomask comprising:
    irradiating the film layer by an exposure light beam with use of the complex photomask, wherein the at least one light-shielding pattern randomly disposed in each of the plurality of semi-transparent regions interferes with the exposure light beam to expose the film layer; and
    performing a development process on the exposed film layer to form the plurality of asymmetric bumps.

13. The manufacturing method of the pixel structure as claimed in claim 7, wherein a material of the pixel electrode comprises metal.

14. The manufacturing method of the pixel structure as claimed in claim 7, the pixel region of the substrate comprising a light reflecting region and an adjacent light transmitting region,
    wherein the plurality of asymmetric bumps is formed in the light reflecting region and the film layer in the light transmitting region is removed in the step of patterning the film layer with use of the complex photomask.

15. The manufacturing method of the pixel structure as claimed in claim 14, wherein a material of the pixel electrode comprises a transparent conductive material.

16. The manufacturing method of the pixel structure as claimed in claim 15, wherein the transparent conductive material comprises indium tin oxide or indium zinc oxide.

17. The manufacturing method of the pixel structure as claimed in claim 14, further comprising:
    forming a reflective electrode on the pixel electrode covering the plurality of asymmetric bumps.

* * * * *